(12) United States Patent
Isozaki

(10) Patent No.: US 12,469,792 B2
(45) Date of Patent: Nov. 11, 2025

(54) SEMICONDUCTOR DEVICE

(71) Applicant: FUJI ELECTRIC CO., LTD., Kawasaki (JP)

(72) Inventor: Makoto Isozaki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 518 days.

(21) Appl. No.: 17/876,228

(22) Filed: Jul. 28, 2022

(65) Prior Publication Data
US 2022/0367372 A1   Nov. 17, 2022

Related U.S. Application Data

(63) Continuation of application No. PCT/JP2021/024996, filed on Jul. 1, 2021.

(30) Foreign Application Priority Data

Aug. 28, 2020  (JP) ................................ 2020-144178

(51) Int. Cl.
*H01L 23/538* (2006.01)
*H01L 23/00* (2006.01)
(Continued)

(52) U.S. Cl.
CPC ........ *H01L 23/5386* (2013.01); *H01L 23/142* (2013.01); *H01L 23/367* (2013.01);
(Continued)

(58) Field of Classification Search
None
See application file for complete search history.

(56) References Cited

U.S. PATENT DOCUMENTS 9,627,302 B2   4/2017   Ichikawa et al.
2006/0258055 A1*  11/2006  Okamoto ............ H01L 23/3735
                                                              257/E23.106
(Continued)

FOREIGN PATENT DOCUMENTS

DE   112014006142 T5   9/2016
JP   H06-164090 A      6/1994
(Continued)

OTHER PUBLICATIONS

International Search Report for PCT/JP2021/024996, mailed on Sep. 28, 2021.
(Continued)

*Primary Examiner* — Nishath Yasmeen
(74) *Attorney, Agent, or Firm* — Rabin & Berdo, P.C.

(57) ABSTRACT

A semiconductor device, including an insulated circuit substrate that has a base plate, a resin layer disposed on a front surface of the base plate, and a circuit pattern disposed on a front surface of the resin layer; and a semiconductor chip that is rectangular in a plan view of the semiconductor device and is bonded to a front surface of the circuit pattern in such a manner that a side edge of the semiconductor chip is spaced inwardly from an outer peripheral edge of the circuit pattern by at least a predetermined distance. Both the predetermined distance and a thickness of the circuit pattern are greater than or equal to 0.1 of a length of one side of the semiconductor chip.

11 Claims, 10 Drawing Sheets

(51) Int. Cl.
   *H01L 23/14* (2006.01)
   *H01L 23/367* (2006.01)
(52) U.S. Cl.
   CPC .............. *H01L 24/45* (2013.01); *H01L 24/48* (2013.01); *H01L 24/85* (2013.01); *H01L 2224/45124* (2013.01); *H01L 2224/45139* (2013.01); *H01L 2224/45144* (2013.01); *H01L 2224/45147* (2013.01); *H01L 2224/48137* (2013.01); *H01L 2224/48225* (2013.01); *H01L 2224/85424* (2013.01); *H01L 2224/85447* (2013.01)

(56) References Cited

U.S. PATENT DOCUMENTS

| | | | |
|---|---|---|---|
| 2010/0041228 | A1 | 2/2010 | Okamoto |
| 2012/0134115 | A1 | 5/2012 | Schulz-Harder et al. |
| 2013/0187190 | A1 | 7/2013 | Muramatsu et al. |
| 2015/0035138 | A1* | 2/2015 | Miyamoto ............ H01L 25/072 257/712 |
| 2016/0233151 | A1* | 8/2016 | Ichikawa ................ H01L 25/18 |
| 2017/0229389 | A1 | 8/2017 | Katsuki |
| 2018/0145007 | A1 | 5/2018 | Hatano et al. |

FOREIGN PATENT DOCUMENTS

| | | | |
|---|---|---|---|
| JP | H106-350212 | A | 12/1994 |
| JP | H11-186679 | A | 7/1999 |
| JP | 2002-217508 | A | 8/2002 |
| JP | 2006-319146 | A | 11/2006 |
| JP | 2010056576 | A * | 3/2010 |
| JP | 2010-103311 | A | 5/2010 |
| JP | 2012-531728 | A | 12/2012 |
| JP | 2013153067 | A | 8/2013 |
| JP | 2013-207226 | A | 10/2013 |
| JP | 2014022579 | A * | 2/2014 |
| JP | 2017-139406 | A | 8/2017 |
| JP | 2017-199830 | A | 11/2017 |
| JP | 2019-071399 | A | 5/2019 |
| JP | 2019-169540 | A | 10/2019 |

OTHER PUBLICATIONS

Written Opinion for PCT/JP2021/024996, mailed on Sep. 28, 2021.
German Office action dated Oct. 1, 2024, in the counterpart German patent application No. 11 2021 000 290.2.
Japanese Office Action issued on Apr. 15, 2025, for corresponding Japanese Patent Application No. 2023-194122.

* cited by examiner

SEMICONDUCTOR DEVICE

CROSS-REFERENCE TO RELATED APPLICATION

This application is a continuation application of International Application PCT/JP2021/024996 filed on Jul. 1, 2021 which designated the U.S., which claims priority to Japanese Patent Application No. 2020-144178, filed on Aug. 28, 2020, the entire contents of which are incorporated herein by reference.

BACKGROUND OF THE INVENTION

1. Field of the Invention

The embodiments discussed herein relate to a semiconductor device.

2. Background of the Related Art

A semiconductor device includes power devices. For example, the power devices are semiconductor chips each having insulated gate bipolar transistors (IGBTs) or power metal oxide semiconductor field effect transistors (MOSFETs). The semiconductor device includes an insulated circuit substrate on which the above semiconductor chips are disposed. The insulated circuit substrate includes a ceramic plate, a circuit pattern formed on the front surface of the ceramic plate, and a metal plate formed on the rear surface of the ceramic plate. The semiconductor chips are bonded to the circuit pattern. In addition, in the semiconductor device, a case is bonded to the insulated circuit substrate along the outer periphery of the insulated circuit substrate via an adhesive material. The case is integrally formed with input and output lead frames. Inside the case, the semiconductor chips and the lead frames are electrically connected with wires (for example, see Japanese Laid-open Patent Publication No. 2017-139406)

The above-described insulated circuit substrate, however, has differences in thermal expansion coefficient between the ceramic plate and the circuit pattern and between the ceramic plate and the metal plate. Therefore, the insulated circuit substrate is warped by heat generated by the semiconductor chips. In addition, in the semiconductor device, when the insulated circuit substrate is repeatedly warped from heat cycling, a crack may occur in the ceramic plate and extend. Such a damage of the ceramic plate reduces the thermal conductivity and insulating property of the insulated circuit substrate and thus reduces the long-term reliability of the semiconductor device.

SUMMARY OF THE INVENTION

According to an aspect, there is provided a semiconductor device, including: an insulated circuit substrate, including a base plate, a resin layer disposed on a front surface of the base plate, and a circuit pattern disposed on a front surface of the resin layer; and a semiconductor chip that is rectangular in a plan view of the semiconductor device and is bonded to a front surface of the circuit pattern in such a manner that a side edge of the semiconductor chip is spaced inwardly from an outer peripheral edge of the circuit pattern by at least a predetermined distance, wherein both the predetermined distance and a thickness of the circuit pattern are greater than or equal to 0.1 of a length of one side of the semiconductor chip.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, the terms "front surface" and "upper surface" refer to surfaces facing up in a semiconductor device 10 of FIG. 2. Similarly, the term "up" refers to an upward direction in the semiconductor device 10 of FIG. 2. The terms "rear surface" and "lower surface" refer to surfaces facing down in the semiconductor device 10 of FIG. 2. Similarly, the term "down" refers to a downward direction in the semiconductor device 10 of FIG. 2. The same directionality applies to the other drawings as needed. The terms "front surface," "upper surface," "up," "rear surface," "lower surface," "down," and "side surface" are used for convenience to describe relative positional relationships, and do not limit the technical ideas of the embodiments. For example, the terms "up" and "down" are not always related to the vertical direction with respect to the ground. That is, the "up" and "down" directions are not limited to the gravity direction. In addition, in the following description, a component contained at a volume ratio of 80 vol % or more is called a "main component."

First Embodiment

Figure 1A:
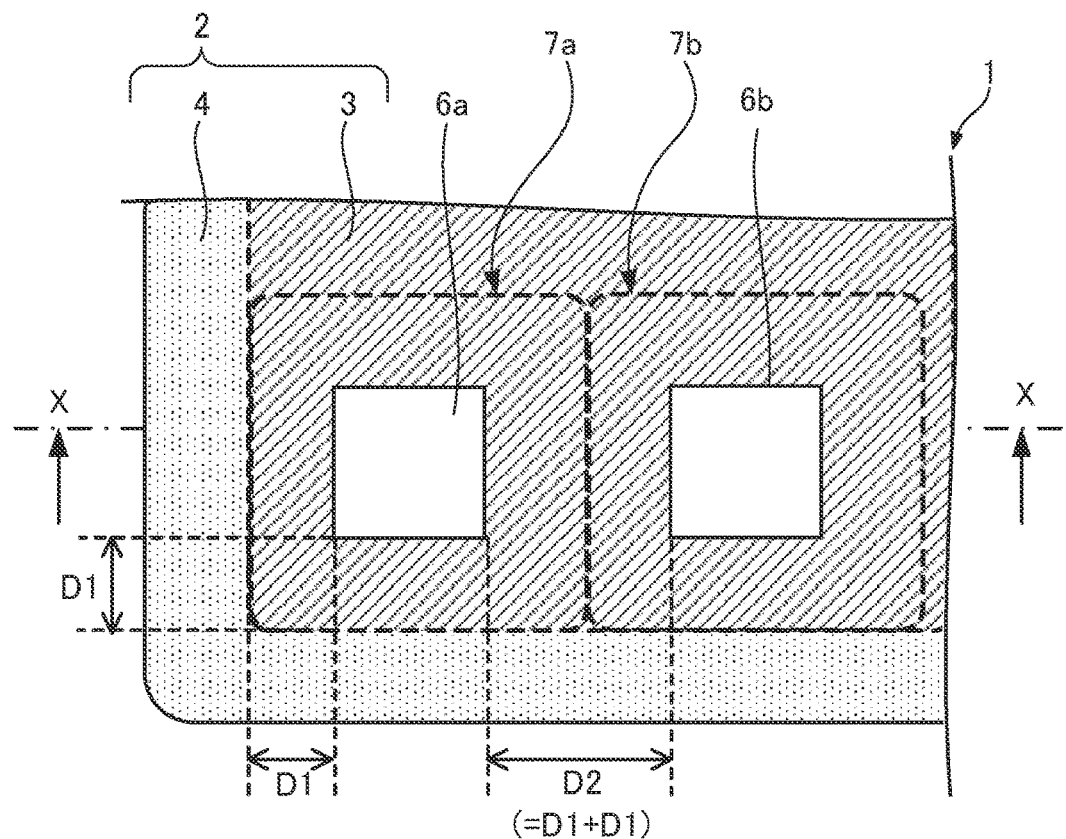
FIGS. 1A and 1B are views for describing a semiconductor device according to a first embodiment.
Figure 1B:
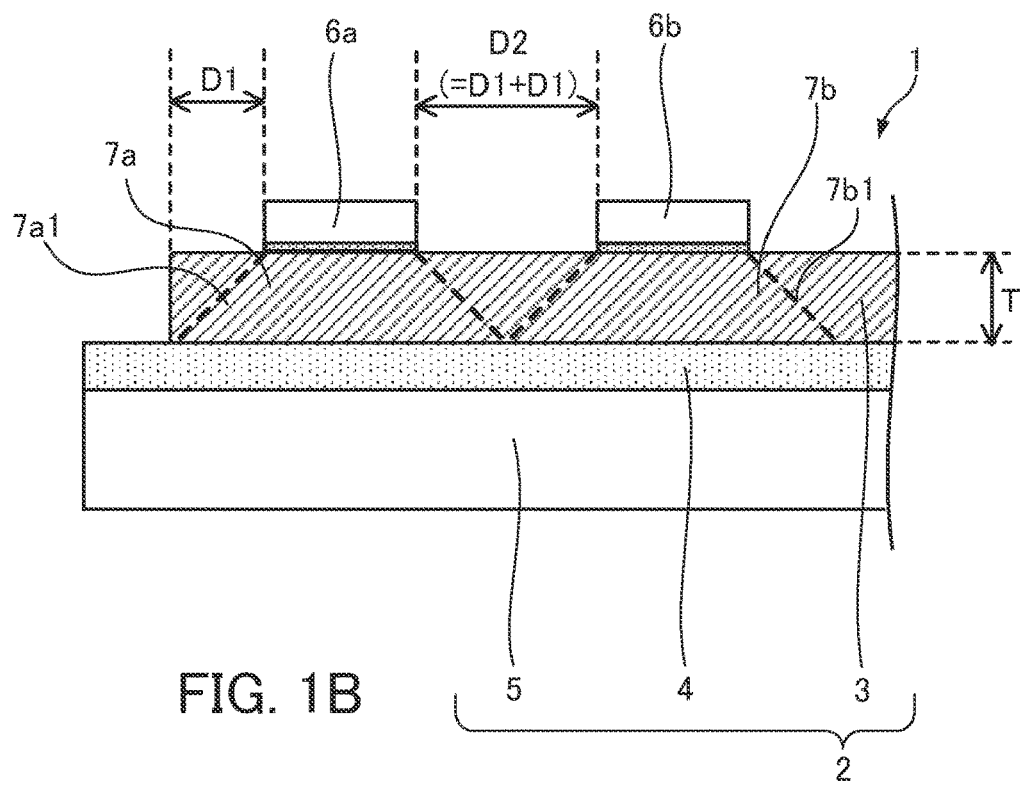

A semiconductor device of a first embodiment will be described with reference to FIGS. 1A and 1B. FIGS. 1A and 1B are views for describing the semiconductor device of the first embodiment. FIG. 1A is an enlarged plan view of a main part of a semiconductor device 1. FIG. 1B is a sectional view taken along the dot-dashed line X-X of FIG. 1A.

The semiconductor device 1 includes an insulated circuit substrate 2 and semiconductor chips 6a and 6b. The insulated circuit substrate 2 includes a circuit pattern 3, a resin layer 4 having a front surface (resin front surface) on which the circuit pattern 3 is formed, and a base plate 5 having a front surface on which the resin layer 4 is formed. The circuit pattern 3 and base plate 5 are made of a metal with electrical conductivity. The resin layer 4 is made of a resin with low thermal resistance and high insulating property. The semiconductor chips 6a and 6b are power devices that are rectangular in plan view. The semiconductor chips 6a and 6b are bonded to the front surface (circuit front surface) of the circuit pattern 3. In addition, the semiconductor chips 6a and 6b are bonded such that the side edges thereof are spaced inwardly from the outer peripheral edge of the circuit pattern 3 by at least a predetermined distance D1. This predetermined distance D1 corresponds to the thickness T of the circuit pattern 3. The thickness T of the circuit pattern 3 is greater than or equal to 0.1 of the length of one side of the semiconductor chips 6a and 6b. More specifically, both of the predetermined distance D1 and the thickness T of the circuit pattern 3 are greater than or equal to 0.1 of the length of one side of the semiconductor chips 6a and 6b. The gap D2 between adjacent side edges of the semiconductor chips 6a and 6b in side view is greater than or equal to twice the predetermined distance D1. In other words, the gap D2 between the adjacent side edges of the semiconductor chips 6a and 6b in the side view is greater than or equal to 0.2 of the length of one side of the semiconductor chips 6a and 6b. In this connection, in the case where the semiconductor chips 6a and 6b are rectangular in plan view, the length of one side of the semiconductor chips 6a and 6b may refer to the length of the short side of the semiconductor chips 6a and 6b.

The differences in thermal expansion coefficient between the circuit pattern 3 and the resin layer 4 and between the base plate 5 and the resin layer 4 in the above-described insulated circuit substrate 2 are smaller than the differences in thermal expansion coefficient between the circuit pattern 3 and a ceramic plate and between the base plate 5 and the ceramic plate. This reduces warping of the insulated circuit substrate 2 due to heat generated by the semiconductor chips 6a and 6b.

During the operation of the semiconductor chips 6a and 6b on the circuit pattern 3, heat generated by the semiconductor chips 6a and 6b spreads in areas (heat spreading areas 7a and 7b) indicated by broken lines in the circuit pattern 3 and is transferred to the resin layer 4. More specifically, in side view, the heat from the semiconductor chips 6a and 6b spreads wider in the circuit pattern 3 as it moves toward the resin layer 4. At this time, the heat from the semiconductor chips 6a and 6b is reliably transferred to the resin layer 4 if nothing interferes with the heat spreading areas 7a and 7b in the circuit pattern 3. In addition, in the case where the heat transfer from the semiconductor chips 6a and 6b has a 45-degree spreading angle, for example, heat spreading outermost edges 7a1 and 7b1 that are the boundaries of the heat spreading areas 7a and 7b in the circuit pattern 3 are beveled at 45 degrees with respect to the vertically downward direction to the rear surfaces of the semiconductor chips 6a and 6b. Therefore, to have the heat spreading areas 7a and 7b entirely contained within the circuit pattern 3 as illustrated in FIG. 1B, the predetermined distance D1 from the outer peripheral edge of the circuit pattern 3 needs to be greater than or equal to the thickness T of the circuit pattern 3. If the predetermined distance D1 is less than the thickness T of the circuit pattern 3, the ends of the heat spreading areas 7a and 7b are not contained within the circuit pattern 3. If this happens, the thermal conductivity of the circuit pattern 3 for the heat from the semiconductor chips 6a and 6b decreases. In addition, the semiconductor chips 6a and 6b need to be disposed apart from each other by at least the gap D2 so that their corresponding heat spreading areas 7a and 7b do not interfere with each other in the circuit pattern 3. This gap D2 needs to be greater than or equal to D1+D1.

In addition, at this time, the thickness T of the circuit pattern 3 needs to be greater than or equal to 0.1 of the length of one side of the semiconductor chips 6a and 6b. As the chip areas of the semiconductor chips 6a and 6b increase, the effect of the thickness T of the circuit pattern on the thermal conductivity of the circuit pattern 3 decreases. In view of this, in order to transfer heat from the semiconductor chips 6a and 6b to the resin layer 4 in the case where the chip areas of the semiconductor chips 6a and 6b are large, the thickness T of the circuit pattern 3 needs to have a certain value. Here, the thickness T of the circuit pattern 3 needs to be greater than or equal to 0.1, more preferably 0.3 of the chip area (the length of one side or the length of the short side if the semiconductor chips are rectangular) of the semiconductor chips 6a and 6b.

The above-described semiconductor device 1 includes the insulated circuit substrate 2 and semiconductor chips 6a and 6b. The insulated circuit substrate 2 includes the base plate 5, the resin layer 4 formed on the front surface of the base plate 5, and the circuit pattern 3 formed on the resin front surface of the resin layer 4. The semiconductor chips 6a and 6b are rectangular in plan view and are bonded to the circuit front surface of the circuit pattern 3 in such a manner that the side edges of the semiconductor chips 6a and 6b are spaced inwardly from the outer peripheral edge of the circuit pattern 3 by at least the predetermined distance D1. In addition, the predetermined distance D1 needs to be greater than or equal to 0.1, more preferably 0.3 of the length of one side (the length of the short side if the semiconductor chips are rectangular) of the semiconductor chips 6a and 6b.

In the semiconductor device 1 configured as above, the difference in thermal expansion coefficient between the base plate 5, resin layer 4, and circuit pattern 3 of the insulated circuit substrate 2 is small, which makes it possible to reduce the occurrence of warping of the insulated circuit substrate 2 due to heat. In addition, the semiconductor chips 6a and 6b are bonded to the circuit front surface of the circuit pattern 3 in such a manner that the side edges of the semiconductor chips 6a and 6b are spaced inwardly from the outer peripheral edge of the circuit pattern 3 by at least the predetermined distance D1. Therefore, nothing interferes with the heat spreading areas 7a and 7b formed in the circuit pattern 3 due to the semiconductor chips 6a and 6b, which prevents a decrease in the heat dissipation performance of the circuit pattern 3 for the semiconductor chips 6a and 6b. As a result, it is achieved to prevent both a decrease in the heat dissipation performance of the semiconductor device 1 and a reduction in the long-term reliability thereof.

Second Embodiment

Figure 2:
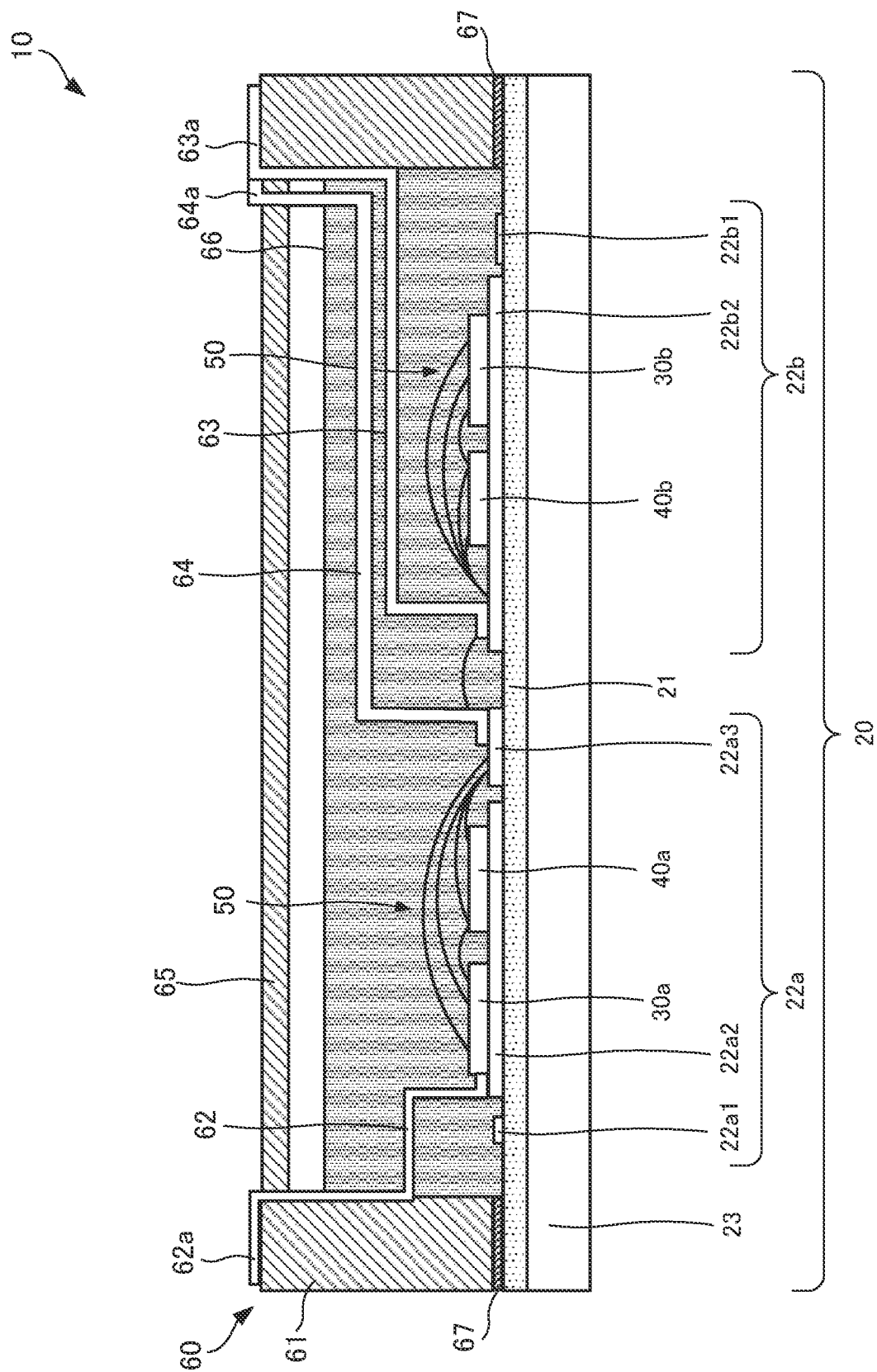
FIG. 2 is a sectional view of a semiconductor device according to a second embodiment.
Figure 3:
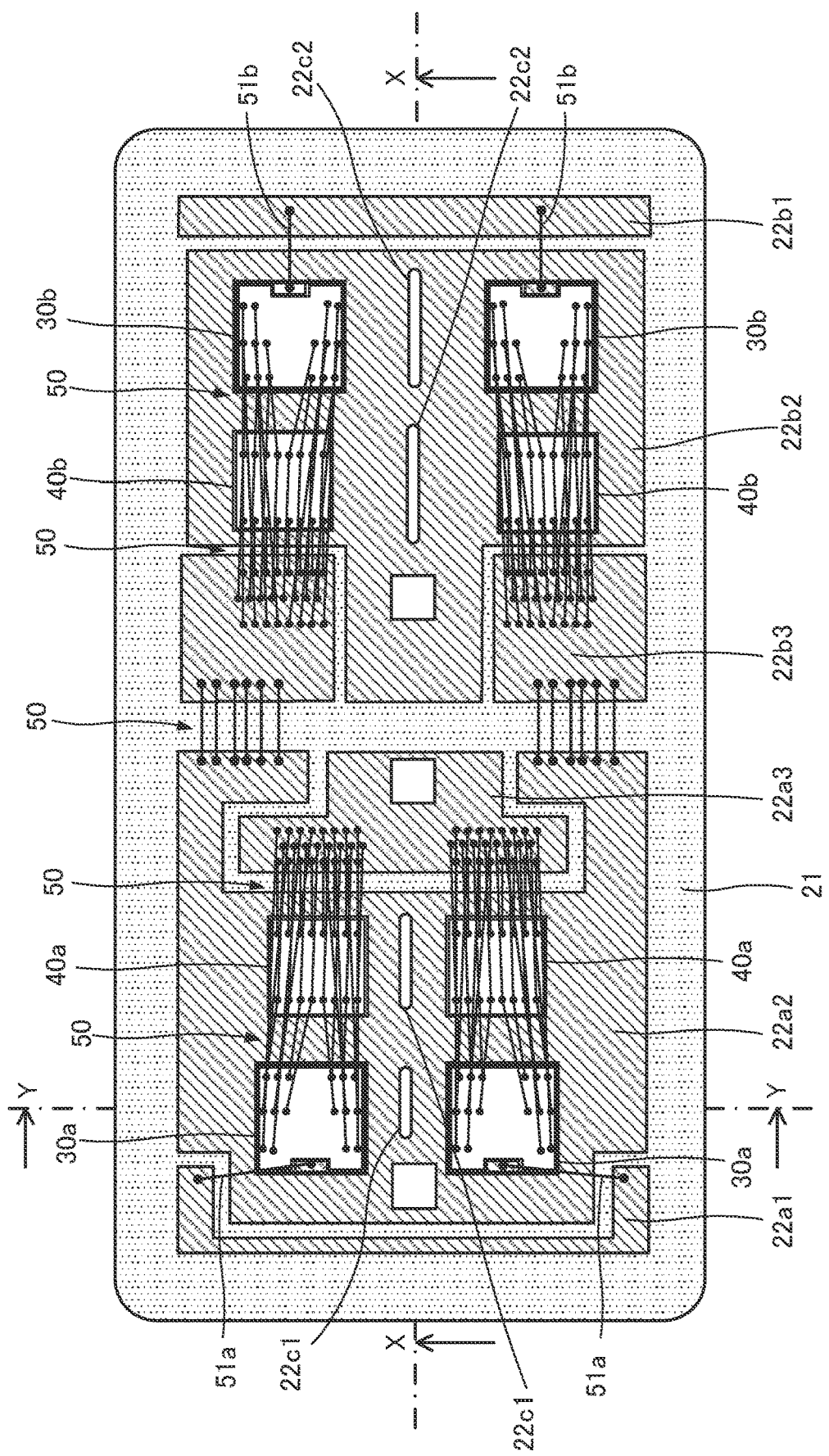
FIG. 3 is a plan view of the semiconductor device according to the second embodiment.
Figure 4:
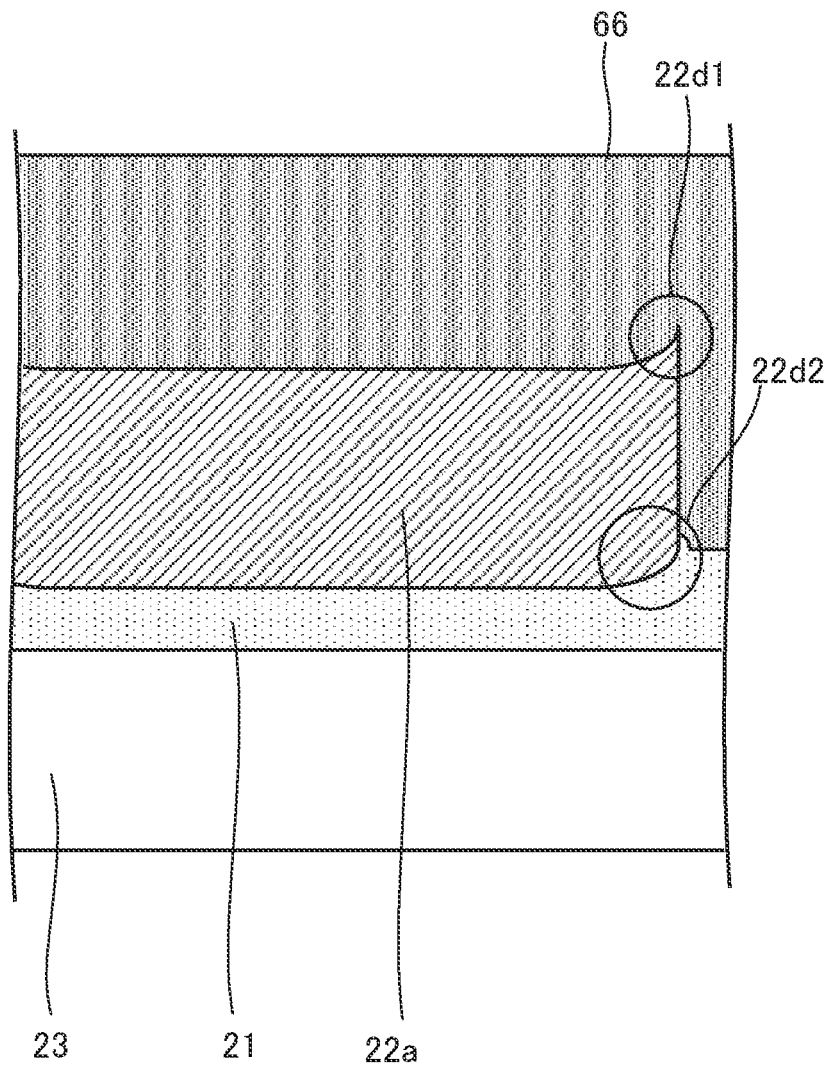
FIG. 4 is a view for describing a circuit pattern according to the second embodiment.
Figure 5:
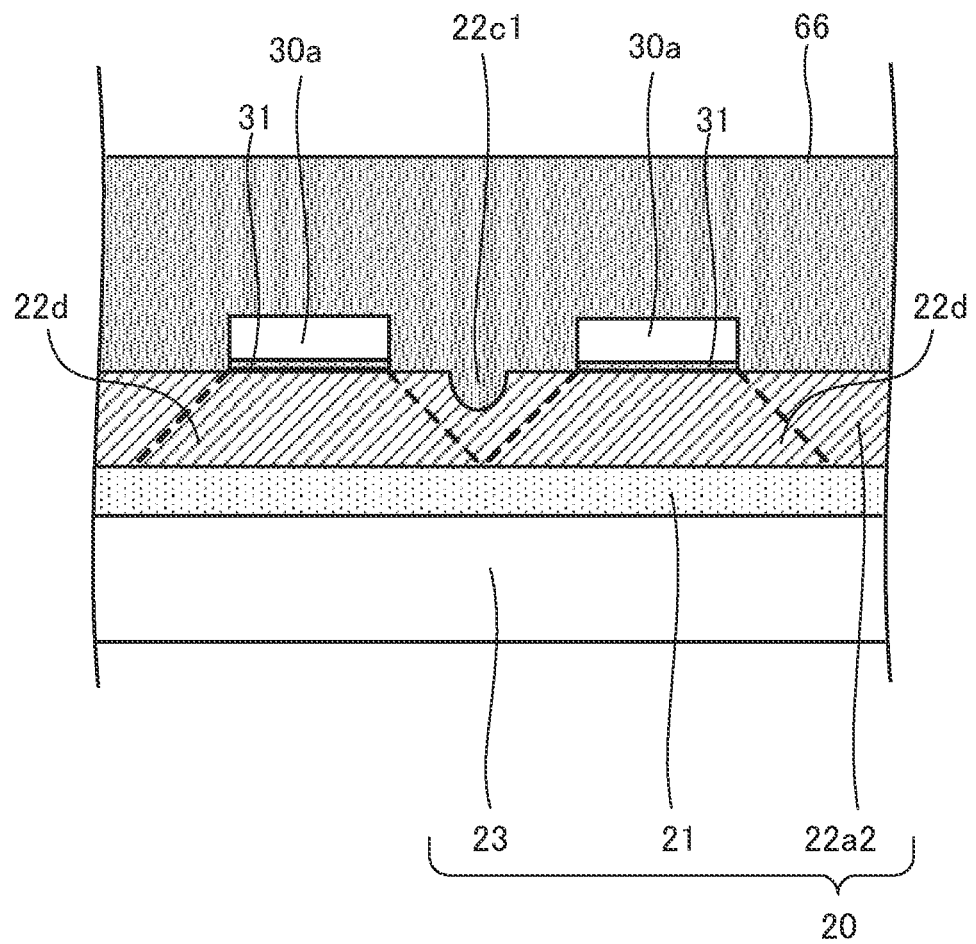
FIG. 5 is a first sectional view of a main part of the semiconductor device according to the second embodiment.
Figure 6:
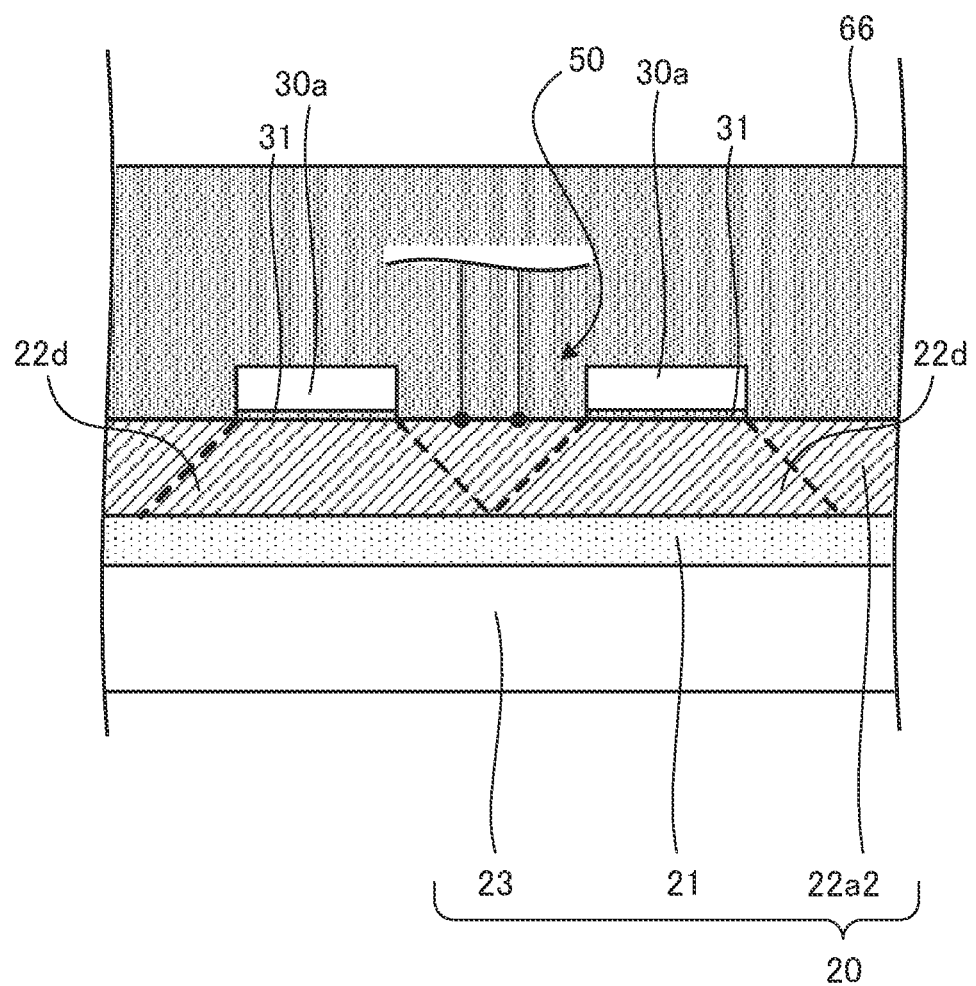
FIG. 6 is a second sectional view of the main part of the semiconductor device according to the second embodiment.

A second embodiment is an implementation of the first embodiment. A semiconductor device of the second embodiment will be described with reference to FIGS. 2 to 6. FIG. 2 is a sectional view of the semiconductor device according to the second embodiment, and FIG. 3 is a plan view of the semiconductor device according to the second embodiment. FIG. 4 is a view for describing a circuit pattern according to the second embodiment. FIGS. 5 and 6 are sectional views of a main part of the semiconductor device according to the second embodiment. In this connection, FIG. 2 is a sectional view taken along the dot-dashed line X-X of FIG. 3. In addition, a case 60 and sealing member 66 of a semiconductor device 10 are not illustrated in FIG. 3. FIG. 4 is an enlarged sectional view of a certain circuit pattern. FIG. 5 is a sectional view taken along the dot-dashed line Y-Y of FIG. 3. FIG. 6 exemplifies the case of connecting wires 50, instead of forming a slit 22c1 in the case of FIG. 5.

The semiconductor device 10 includes an insulated circuit substrate 20, semiconductor chips 30a, 40a, 30b, and 40b, and the case 60 accommodating the insulated circuit substrate 20 and semiconductor chips 30a, 40a, 30b, and 40b. The insulated circuit substrate 20 includes a resin layer 21, circuit patterns 22a and 22b, and a base plate 23. In this connection, the circuit pattern 22a is used as a general term for circuit patterns 22a1 to 22a3, and the circuit pattern 22b is used as a general term for circuit patterns 22b1 to 22b3. In the following description, the terms "circuit pattern 22a" and "circuit pattern 22b" are used to respectively refer to the circuit patterns 22a1 to 22a3 and the circuit patterns 22b1 to 22b3 without distinction among them.

The resin layer 21 is made of a resin with low thermal resistance and high insulating property. For example, a thermosetting resin is used as the resin. The thermosetting resin may contain a thermal conductive filler. The addition of the thermal conductive filler further reduces the thermal resistance of the resin layer 21 and also reduces a difference in thermal expansion coefficient between the resin layer 21 and the base plate 23. As an example of the thermosetting resin, at least one of the following resins is used: an epoxy resin, a cyanate resin, a benzoxazine resin, an unsaturated polyester resin, a phenolic resin, a melamine resin, a silicone resin, a maleimide resin, an acrylic resin, and a polyamide resin. The thermal conductive filler is made of at least one of oxide and nitride. Examples of oxide include silicon oxide and aluminum oxide. Examples of nitride include silicon nitride, aluminum nitride, and boron nitride. In addition, hexagonal boron nitride may be used as the thermal conductive filler. The thickness of the resin layer 21 depends on the rated voltage of the semiconductor device 10. More specifically, it is desired that the resin layer 21 is made thicker as the rated voltage of the semiconductor device 10 increases. On the other hand, it is also desired that the resin layer 21 is made as thin as possible to reduce the thermal resistance. For example, the thickness of this resin layer 21 is in the range of 0.05 mm to 0.50 mm, inclusive.

The circuit patterns 22a and 22b are made of a material with high electrical conductivity. Examples of the material include copper, aluminum, and an alloy containing at least one of these. The thicknesses of the circuit patterns 22a and 22b are preferably in the range of 0.1 mm to 5.0 mm, inclusive, and are more preferably in the range of 0.2 mm to 2.0 mm, inclusive. In this connection, the thickness of each circuit pattern 22a and 22b will be described in detail later.

The circuit patterns 22a and 22b are obtained by punching one conductive plate in desired pattern shapes. Thus obtained circuit patterns 22a and 22b each have a burr at the outer peripheral edge of one principal surface thereof and a sag at the outer peripheral edge of the other principal surface opposite to the one principal surface thereof, depending on the punching direction. For example, as illustrated in FIG. 4, the circuit pattern 22a is disposed on the resin layer 21 in such a manner that the rear surface thereof facing the resin layer 21 has the sag 22d2 and the front surface thereof has the burr 22d1. If the circuit pattern 22a is disposed on the resin layer 21 in such a manner that the rear surface of the circuit pattern 22a has the burr 22d1, there is a risk that the burr 22d1 may pierce through the resin layer 21, depending on the thickness of the resin layer 21. If this happens, the resin layer 21 may fail to maintain the insulating property from the circuit pattern 22a and the base plate 23. On the other hand, the circuit pattern 22a is disposed on the resin layer 21 in such a manner that the rear surface of the circuit pattern 22a has the sag 22d2. In this case, the sag 22d2 enables the circuit pattern 22a to adhere to the resin layer 21 easily. Therefore, the circuit pattern 22a is fixed to the resin layer 21 reliably, and the peeling of the circuit pattern 22a from the resin layer 21 is prevented. In this connection, the circuit pattern 22b having a burr 22d1 and a sag 22d2 is disposed on the resin layer 21 in the same manner as described above.

The semiconductor chips 30a and 40a and the semiconductor chips 30b and 40b are respectively bonded onto the circuit pattern 22a2 and the circuit pattern 22b2 via a solder. In this connection, other than the semiconductor chips 30a and 40a and semiconductor chips 30b and 40b, wiring members such as wires, lead frames, and connection terminals, and electronic components may be disposed on the circuit pattern 22a and circuit pattern 22b according to necessity. Rectangles illustrated in the circuit patterns 22a2, 22a3, and 22b2 represent bonding portions for lead frames 62 to 64. Plating may be performed on the circuit patterns 22a and 22b using a material with high corrosion resistance. Examples of the material include nickel and an alloy containing nickel.

In addition, the circuit pattern 22a2 has slits 22c1 between the semiconductor chips 30a and between the semiconductor chips 40a. FIG. 5 illustrates the case where a slit 22c1 is formed between the semiconductor chips 30a. Similarly, the circuit pattern 22b2 has slits 22c2 between the semiconductor chips 30b and between the semiconductor chips 40b. The slits 22c1 reduce thermal interference between the semiconductor chips 30a and between the semiconductor chips 40a. Likewise, the slits 22c2 reduce thermal interference between the semiconductor chips 30b and between the semiconductor chips 40b.

In this connection, the quantity, locations, and shapes of the circuit patterns 22a and 22b illustrated in FIGS. 2 and 3 are just an example, and the quantity, locations, and shapes thereof may be set appropriately according to design.

The base plate 23 is made of a material with high thermal conductivity. Examples of the material include aluminum, iron, silver, copper, and an alloy containing at least one of these. In addition, a metal composite may be used as the material. Examples of the metal composite include aluminum-silicon carbide (Al—SiC) and magnesium-silicon carbide (Mg—SiC). In addition, to improve corrosion resistance, plating may be performed on the surface of the base plate 23. Examples of the plating material used here include nickel, a nickel-phosphorus alloy, and a nickel-boron alloy. The thickness of the plating film is preferably greater than or equal to 1 μm, and is more preferably greater than or equal to 5 μm. In addition, a cooling unit (not illustrated) may be attached to the rear surface of the base plate 23 via a solder or a silver solder, as will be described later. This improves the heat dissipation performance of the semiconductor device 10. The cooling unit in this case is made of a metal with high thermal conductivity. The metal here may be aluminum, iron, silver, copper, or an alloy containing at least one of these. In addition, as the cooling unit, a heat sink with one or more fins or a cooling device using cool water may be used. In addition, the base plate 23 may integrally be formed with such a cooling unit. In this case, the base plate 23 is made of aluminum, iron, silver, copper, or an alloy containing at least one of these, which has high thermal conductivity. In order to improve the corrosion resistance, for example, plating may be performed on the surface of the base plate 23 integrally formed with the cooling unit. Examples of the plating material used here include nickel, a nickel-phosphorus alloy, and a nickel-boron alloy. In this connection, the thickness of the base plate 23 is preferably in the range of 2 mm to 10 mm, inclusive.

Therefore, the above-described insulated circuit substrate 20 has small differences in thermal expansion coefficient between the circuit patterns 22a and 22b and the resin layer 21 and between the base plate 23 and the resin layer 21. As a result, even when heat is generated by the semiconductor chips 30a, 40a, 30b, and 40b, the occurrence of warping of the insulated circuit substrate 20 is reduced.

By the way, the thermal resistance of the circuit pattern 22a2 and circuit pattern 22b2 (with the thicknesses fixed) on which the semiconductor chips 30a and 40a and semiconductor chips 30b and 40b are disposed is related to the chip areas of the semiconductor chips 30a and 40a and semiconductor chips 30b and 40b. More specifically, as the chip areas increase, the thermal resistance of the circuit pattern 22a2 and circuit pattern 22b2 decreases. In addition, the thermal resistance of the circuit pattern 22a2 and circuit pattern 22b2 (in the case where the chip areas are fixed) is related to the thicknesses of the circuit pattern 22a2 and circuit pattern 22b2. More specifically, as the thicknesses of the circuit pattern 22a2 and circuit pattern 22b2 increase, the thermal resistance of the circuit pattern 22a2 and circuit pattern 22b2 decreases. In view of this, in each case where the circuit pattern 22a2 and circuit pattern 22b are 0.1 mm, 0.3 mm, 0.4 mm, 0.5 mm, 0.8 mm, and 1.0 mm in thickness, the thermal resistance of the circuit pattern 22a2 and circuit pattern 22b2 was measured while changing the chip areas. As results of the measurement, it was confirmed that the thermal resistance of the circuit pattern 22a2 and circuit pattern 22b2 decreased with increase in the chip areas, in the case where the circuit pattern 22a2 and circuit pattern 22b2 had any of the above listed thicknesses. It is confirmed from the results that, when the thicknesses of the circuit pattern 22a2 and circuit pattern 22b2 are greater than or equal to 0.5 mm, the thermal resistance thereof decreases, in view of a reference thermal resistance of the circuit pattern 22a2 and circuit pattern 22b2 relative to their thicknesses. Therefore, the thicknesses of the circuit pattern 22a2 and circuit pattern 22b2 are preferably greater than or equal to 0.5 mm. In addition, because output currents from the semiconductor chips 30a and 30b are input to the circuit patterns 22a3 and 22b3, the circuit patterns 22a3 and 22b3 need to have certain thicknesses. Therefore, considering a reduction in the manufacturing cost, the thicknesses of the circuit patterns 22a3 and 22b3 are preferably greater than or equal to 0.5 mm, as with the circuit patterns 22a2 and 22b2. On the other hand, control signals for the semiconductor chips 30a and 30b pass through the circuit patterns 22a1 and 22b1. Therefore, the circuit patterns 22a1 and 22b1 do not need to have high heat dissipation performance. That is, the circuit patterns 22a1 and 22b1 do not need to be as thick as the other circuit patterns 22a2, 22a3, 22b2, and 22b3.

For example, the above-described insulated circuit substrate 20 is manufactured as follows. First, the circuit patterns 22a and 22b are obtained in advance by punching a conductive plate. Thus obtained circuit patterns 22a and 22b, the resin layer 21, and the base plate 23 are stacked, and are press-bonded by applying pressure in the stacking direction while heating. The press-bonding is performed in an active gas atmosphere or in a vacuum. By doing so, the insulated circuit substrate 20 is obtained. Alternatively, the following method may be used. First, the base plate 23, the resin layer 21, and a conductive plate are stacked in order, and are press-bonded by applying pressure in the stacking direction while heating in the same manner as above. Then, masking is performed by applying a photosensitive resist mask to the conductive plate according to a predetermined pattern, etching is performed to form a pattern, and then the photosensitive resist mask is removed, so that the circuit patterns 22a and 22b are formed. Dicing is then performed, so that the insulated circuit substrate 20 is obtained.

The semiconductor chips 30a, 40a, 30b, and 40b are power devices that are made using silicon or a wide bandgap semiconductor as a main component. Examples of the wide bandgap semiconductor include silicon nitride and gallium nitride. In addition, the chip areas (the length of one side) of the semiconductor chips 30a, 40a, 30b, and 40b are less than or equal to 5.5 mm. The semiconductor chips 30a and 30b each include a switching element. The switching element is a power MOSFET or an IGBT. For example, such semiconductor chips 30a and 30b each have a drain electrode (a positive electrode, or a collector electrode in the case of IGBT) serving as a main electrode on the rear surface thereof and have a gate electrode (a control electrode) and a source electrode (a negative electrode, or an emitter electrode in the case of IGBT) serving as a main electrode on the front surface thereof. The semiconductor chips 40a and 40b each include a diode element. The diode element is a freewheeling diode (FWDs) such as a Schottky barrier diode (SBD) or P-intrinsic-N (PiN) diode. Such semiconductor chips 40a and 40b each have a cathode electrode serving as a main electrode on the rear surface thereof and have an anode electrode serving as a main electrode on the front surface thereof. The rear surfaces of the semiconductor chips 30a and 40a and semiconductor chips 30b and 40b are bonded to the circuit patterns 22a2 and 22b2 with a solder 31 (see FIG. 5 and others). In this connection, a lead-free solder containing a predetermined alloy as a main component is used as the solder 31. For example, the predetermined alloy is one of a tin-silver-copper alloy, a tin-zinc-bismuth alloy, a tin-copper alloy, and a tin-silver-indium-bismuth alloy. In addition, the solder 31 may contain an additive. Examples of the additive include nickel, germanium, cobalt, and silicon. The bonding may be achieved by sintering using a sintered material, instead of using the solder 31. For example, the sintered material in this case is a powder containing copper or aluminum as a main component. The thicknesses of the semiconductor chips 30a, 40a, 30b, and 40b are in the range of 80 μm to 500 μm, inclusive, and are approximately 200 μm on average, for example. In this connection, electronic parts may be disposed on the circuit patterns 22a and 22b according to necessity. Examples of the electronic parts include a capacitor, a resistor, a thermistor, a current sensor, and a control integrated circuit (IC). In place of the semiconductor chips 30a and 40a and semiconductor chips 30b and 40b, semiconductor chips each including a reverse conducting (RC)-IGBT switching element in which an IGBT and FWD are configured in one chip may be disposed. FIG. 3 exemplifies the case where two sets each of semiconductor chips 30a and 40a and two sets each of semiconductor chips 30b and 40b are respectively disposed on the circuit pattern 22a2 and the circuit pattern 22b2. Alternatively, one set of semiconductor chips or three or more sets of semiconductor chips may be disposed appropriately according to design.

The semiconductor chips 30a and 40a are spaced inwardly from the outer peripheral edge of the circuit pattern 22a2 by at least a distance corresponding to the thickness of the circuit pattern 22a2. Similarly, the semiconductor chips 30b and 40b are spaced inwardly from the outer peripheral edge of the circuit pattern 22b2 by at least a distance corresponding to the thickness of the circuit pattern 22b2. With this configuration, the heat spreading areas in the circuit pattern 22a2 and circuit pattern 22b2 for heat from the semiconductor chips 30a and 40a and semiconductor chips 30b and 40b are free from interference from outside or from each other. It is thus achieved to prevent a decrease in the heat dissipation performance of the circuit pattern 22a2 and circuit pattern 22b2 for the semiconductor chips 30a and 40a and semiconductor chips 30b and 40b.

In addition, as illustrated in FIG. 5, the semiconductor chips 30a are disposed on the circuit pattern 22a2 with a gap therebetween so that the heat spreading areas 22d do not interfere with each other in the circuit pattern 22a2. At this time, the slit 22c1 formed between the semiconductor chips 30a in the circuit pattern 22a2 has such a depth that the slit 22c1 does not interfere with these two heat spreading areas 22d. Therefore, the slit 22c1 does not adversely affect the prevention of decrease in the heat dissipation performance of the circuit pattern 22a2 for the semiconductor chips 30a. Please note that this is the same with the slits 22c1 and 22c2 formed between the semiconductor chips 40a, between the semiconductor chips 30b, and between the semiconductor chips 40b.

Further, for example, wires 50 may be connected to the portion between the semiconductor chips 30a according to design, as illustrated in FIG. 6. In this case as well, the wires 50 do not adversely affect the prevention of decrease in the heat dissipation performance of the circuit pattern 22a2 for the semiconductor chips 30a. Please note that this is the same with the case of connecting wires 50 to the portions between the semiconductor chips 40a, between the semiconductor chips 30b, and between the semiconductor chips 40b. The wires 50 will be described in detail below.

The wires 50 provide electrical and mechanical connections among the main electrodes of the semiconductor chips 30a and 40a and the circuit pattern 22a, among the main electrodes of the semiconductor chips 30b and 40b and the circuit pattern 22b, between the main electrodes of the semiconductor chips 30a and 40a, and between the main electrodes of the semiconductor chips 30b and 40b. In addition, wires 51a and 51b provide electrical and mechanical connections between the circuit pattern 22a1 and the control electrode of the semiconductor chip 30a and between the circuit pattern 22b1 and the control electrode of the semiconductor chip 30b. These wires 50, 51a, and 51b are made of a material with high electrical conductivity. Examples of the material include gold, silver, copper, aluminum, and an alloy containing at least one of these. For example, the diameters of the wires 50 are in the range of 390 μm to 410 μm, inclusive. For example, the diameters of the wires 51a and 51b are in the range of 120 μm to 130 μm, inclusive.

The case 60 has a frame portion 61 and a lid 65 provided on the top of the opening of the frame portion 61. In plan view, the frame portion 61 has a frame shape with the opening penetrating from the front surface to the rear surface thereof at the central part. In addition, the frame portion 61 includes the lead frames 62 to 64. The frame portion 61 is integrally formed with the lead frames 62 to 64 by insert molding. The insert molding uses a thermoplastic resin that is able to be bonded to the lead frames 62 to 64. Examples of the resin include a polyphenylene sulfide resin, a polybutylene terephthalate resin, a polybutylene succinate resin, a polyamide resin, and an acrylonitrile butadiene styrene resin. The lid 65 is made of the same material as the frame portion 61.

The lead frames 62 to 64 have a crank shape in side view as illustrated in FIG. 2, for example. One-end terminals 62a to 64a of the lead frames 62 to 64 are exposed from the top surface of the lid 65 of the case 60 and are placed on the frame portion 61. The other ends of the lead frames 62 to 64 are electrically and mechanically bonded to the circuit patterns 22a2, 22a3, and 22b2 via a solder (not illustrated) inside the frame portion 61. These lead frames 62 to 64 are made of a material with high electrical conductivity. Examples of the material include copper, aluminum, and an alloy containing at least one of these. The thicknesses of the lead frames 62 to 64 are in the range of 1.00 mm to 2.00 mm, inclusive, and more preferably in the range of 1.20 mm to 1.50 mm, inclusive. Plating may be performed on the lead frames 62 to 64 using a material with high corrosion resistance. Examples of this material include nickel or an alloy containing nickel.

The rear surface of the frame portion 61 of the case 60 is firmly attached to the outer peripheral edge of the insulated circuit substrate 20 (resin layer 21) with an adhesive material 67. For example, a thermosetting resin adhesive or an organic adhesive is used as the adhesive material 67. The thermosetting resin adhesive contains an epoxy resin or a phenolic resin as a main component, for example. The organic adhesive is an elastomer adhesive containing silicone rubber or chloroprene rubber as a main component, for example. The semiconductor chips 30a, 40a, 30b, and 40b and others are accommodated in the opening of the frame portion 61 as described above, and the opening is sealed with the sealing member 66. In this connection, the sealing member 66 only needs to seal the insulated circuit substrate 20, semiconductor chips 30a, 40a, 30b, and 40b, and wires 50, 51a, and 51b in the opening of the frame portion 61. The sealing member 66 does not need to entirely fill the opening of the frame portion 61.

The sealing member 66 contains a thermosetting resin and a filler, which is added to the thermosetting resin. Examples of the thermosetting resin include an epoxy resin, a phenolic resin, a maleimide resin, and a polyester resin. One example of the sealing member 66 is an epoxy resin, and a filler is contained in the epoxy resin. Examples of the filler include silicon oxide, aluminum oxide, boron nitride, and aluminum nitride. Alternatively, a thermoplastic resin may be used as the sealing member 66. Examples of the thermoplastic resin include a polyphenylene sulfide resin, a polybutylene terephthalate resin, a polybutylene succinate resin, a polyamide resin, and an acrylonitrile butadiene styrene resin.

To seal the inside of the case 60 with the sealing member 66, the sealing member 66 in melt state is injected into the case 60. At this time, to maintain the viscosity of the sealing member 66 in melt state, the sealing member 66, case 60, and semiconductor chips 30a, 40a, 30b, and 40b are heated to maintain a predetermined temperature. In addition, by injecting the sealing member 66 in a vacuum, the sealing member 66 spreads to every corner of the case 60 without causing voids. In addition, before the injecting, deforming is performed on the sealing member 66 to remove voids in a vacuum. After the deforming, the sealing member 66 in melt state is stirred in a vacuum to achieve complete deforming, so as to further prevent the occurrence of voids. Alternatively, while injecting the sealing member 66 in melt state, ultrasonic vibration may be applied to the case 60, insulated circuit substrate 20, and others. This makes it possible to prevent the occurrence of voids in the sealing member 66 more reliably.

The above-described semiconductor device 10 has small difference in thermal expansion coefficient between the base plate 23, resin layer 21, and circuit patterns 22a and 22b included in the insulated circuit substrate 20, which reduces the occurrence of warping of the insulated circuit substrate 20 due to heat. In addition, the semiconductor chips 30a and 40a and semiconductor chips 30b and 40b are bonded to the front surfaces of the circuit pattern 22a2 and circuit pattern 22b2 in such a manner that the side edges thereof are spaced inwardly from the outer peripheral edges of the circuit pattern 22a2 and circuit pattern 22b2 by at least a predetermined distance. Therefore, nothing interferes with the heat spreading areas formed in the circuit pattern 22a2 and circuit pattern 22b2 due to the semiconductor chips 30a and 40a and the semiconductor chips 30b and 40b, which prevents a decrease in the heat dissipation performance of the circuit pattern 22a2 and circuit pattern 22b2 for the semiconductor chips 30a and 40a and semiconductor chips 30b and 40b. As a result, it is achieved to prevent both a decrease in the heat dissipation performance of the semiconductor device 10 and a reduction in the long-term reliability thereof.

Third Embodiment

Figure 7:
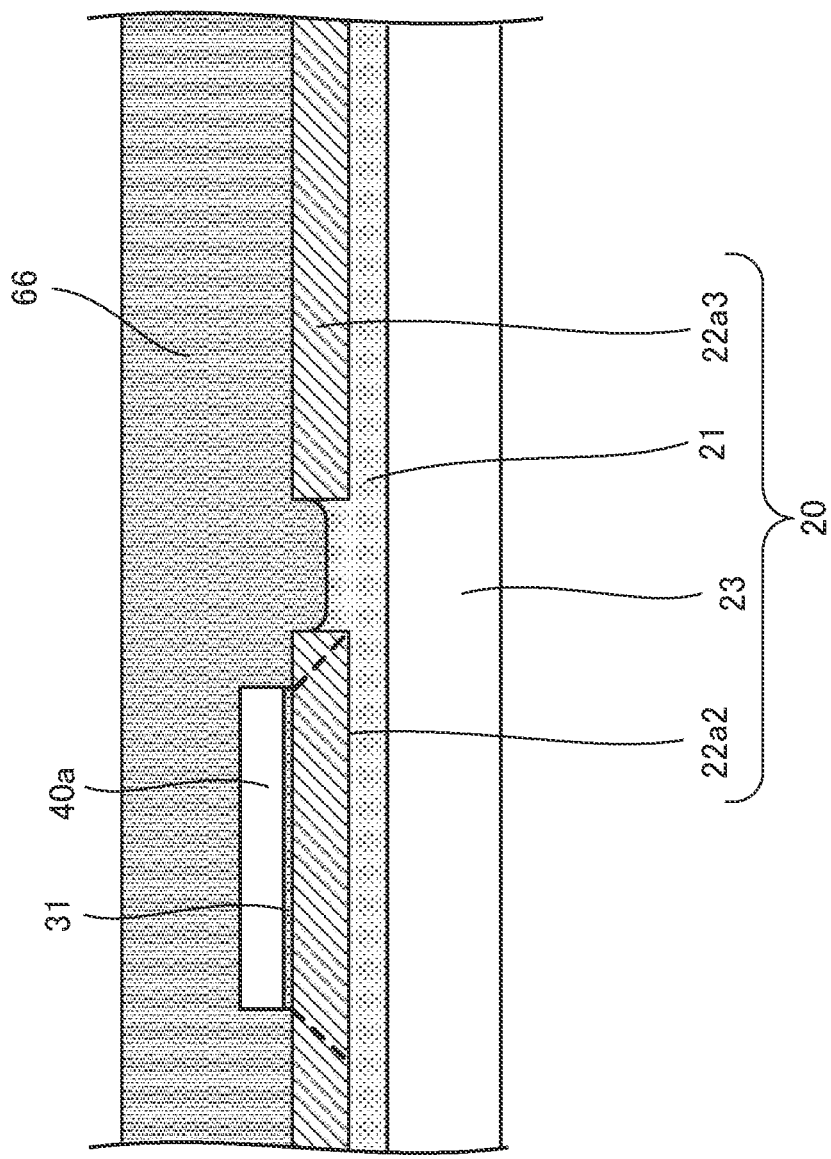
FIG. 7 is a sectional view of a main part of a semiconductor device according to a third embodiment.

A third embodiment describes the case where the lower portions of the circuit patterns 22a and 22b are partly embedded in the resin layer 21 in the insulated circuit substrate 20 provided in the semiconductor device 10 of the second embodiment. This case will be described below with reference to FIG. 7. FIG. 7 is a sectional view of a main part of a semiconductor device according to the third embodiment. In this connection, FIG. 7 corresponds to a sectional view taken along the dot-dashed line X-X of the semiconductor device 10 of FIG. 3, and illustrates an area around the semiconductor chip 40a illustrated in this sectional view. In addition, in FIG. 7, circuit patterns 22a2 and 22a3 each have a rectangular cross section. The circuit patterns 22a2 and 22a3 may have a burr on the front surfaces thereof and a sag on the rear surfaces thereof, as illustrated in FIG. 4.

In this case, in an insulated circuit substrate 20, about the lower half parts of the circuit patterns 22a2 and 22a3 are embedded in a resin layer 21. A sealing member 66 enters between the circuit patterns 22a2 and 22a3, and the circuit patterns 22a2 and 22a3 are pressed toward a base plate 23. Therefore, the circuit patterns 22a2 and 22a3 are prevented from peeling off the resin layer 21. Even if sides of the circuit patterns 22a2 and 22a3 are peeled off the resin layer 21, this does not affect much a decrease in the heat dissipation performance of the insulated circuit substrate 20. However, if the rear surfaces of the circuit patterns 22a2 and 22a3 are peeled off the resin layer 21, the heat dissipation performance of the insulated circuit substrate 20 decreases. By preventing the circuit patterns 22a2 and 22a3 from peeling off the resin layer 21, as illustrated in FIG. 7, it is achieved to prevent the decrease in the heat dissipation performance of the insulated circuit substrate 20. This is the same with the other circuit patterns 22a and 22b, in addition to the circuit patterns 22a2 and 22a3. As a result, it is achieved to prevent both a decrease in the heat dissipation performance of the semiconductor device 10 and a reduction in the long-term reliability thereof.

Fourth Embodiment

Figure 8:
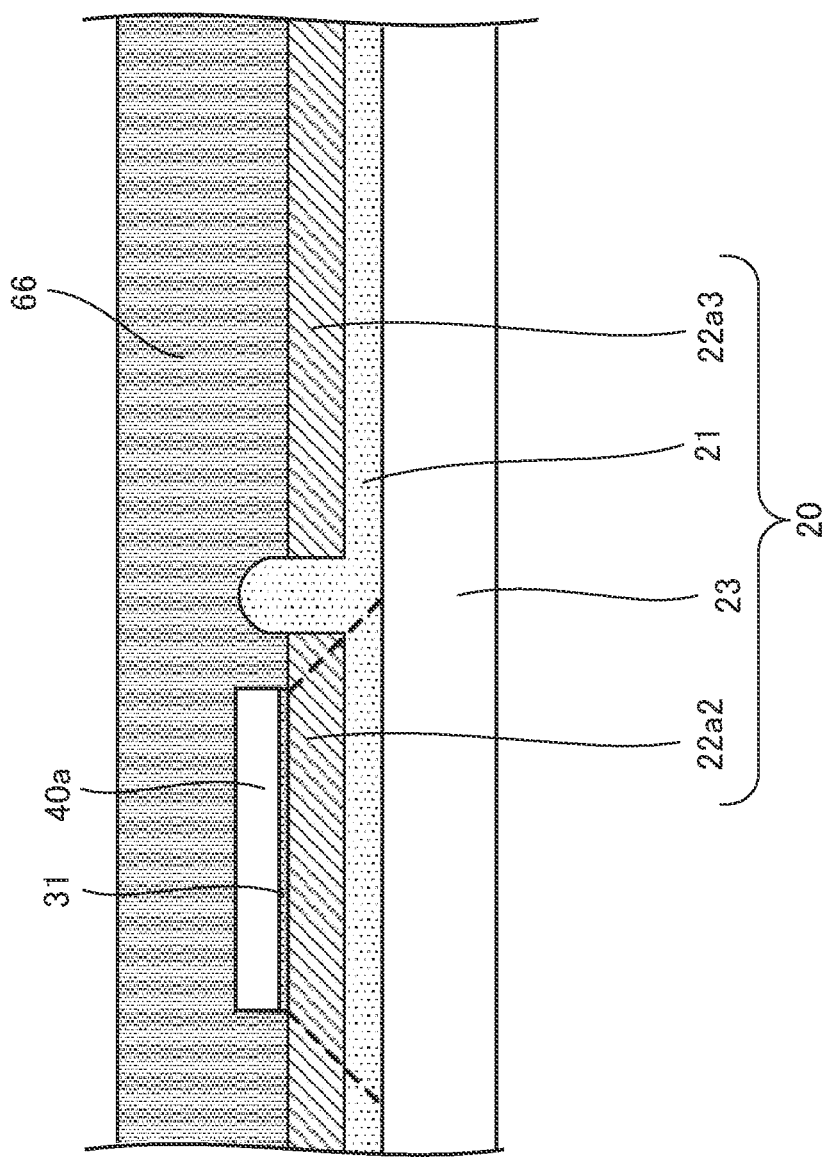
FIG. 8 is a first sectional view of a main part of a semiconductor device according to a fourth embodiment.
Figure 9:
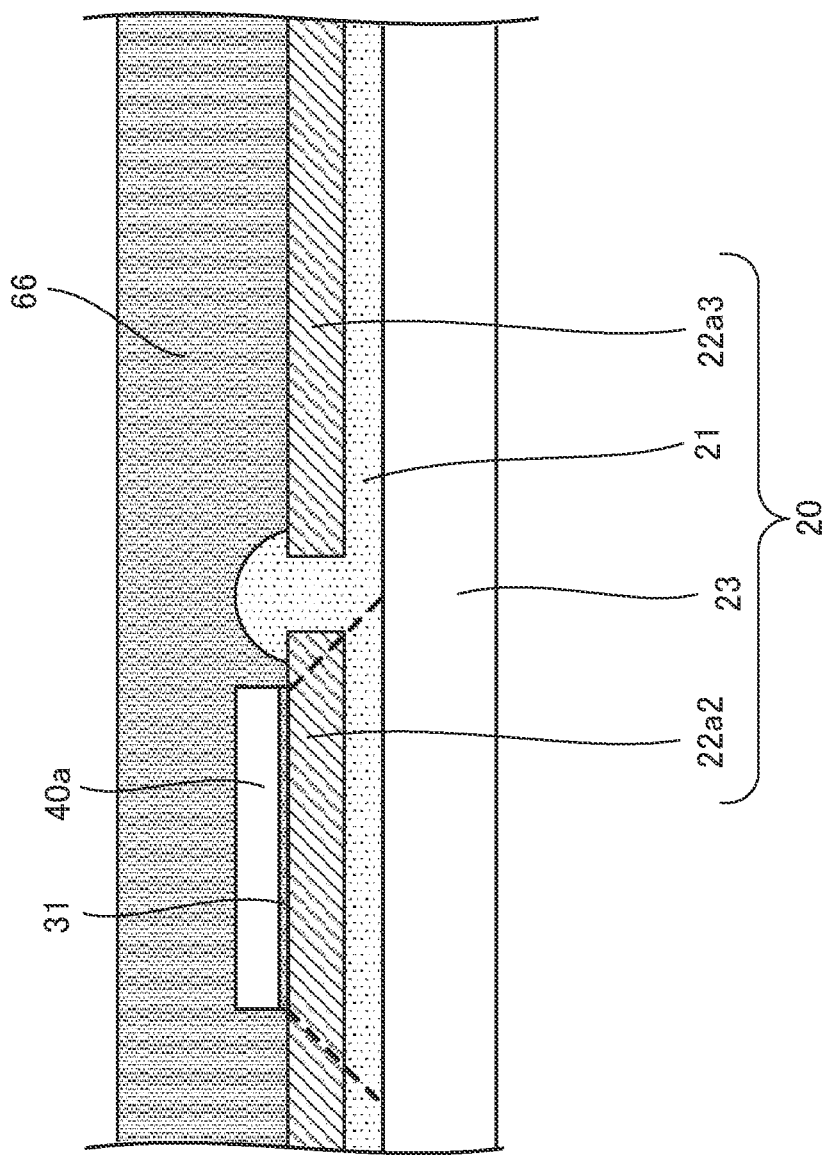
FIG. 9 is a second sectional view of the main part of the semiconductor device according to the fourth embodiment.

A fourth embodiment describes the case where the circuit patterns 22a and 22b are entirely embedded in the resin layer 21 in the insulated circuit substrate 20 provided in the semiconductor device 10 of the second embodiment. This case will be described below with reference to FIGS. 8 and 9. FIGS. 8 and 9 are sectional views of a main part of a semiconductor device according to the fourth embodiment. In this connection, FIGS. 8 and 9 correspond to a sectional view taken along the dot-dashed line X-X of the semiconductor device 10 of FIG. 3, and illustrates an area around the semiconductor chip 40a illustrated in this sectional view. In addition, in FIGS. 8 and 9, circuit patterns 22a2 and 22a3 each have a rectangular cross section. The circuit patterns 22a2 and 22a3 may have a burr on the front surfaces thereof and a sag on the rear surfaces thereof, as illustrated in FIG. 4.

In this case, in an insulated circuit substrate 20, the circuit patterns 22a2 and 22a3 are embedded in a resin layer 21 in such a manner that the front surfaces of the circuit patterns 22a2 and 22a3 are flush with the front surface of the resin layer 21. As described in the second embodiment, the insulated circuit substrate 20 is obtained by press-bonding the circuit patterns 22a and 22b to the resin layer 21. In this press-bonding, the circuit patterns 22a and 22b are pressed against the resin layer 21 with higher pressure. By doing so, the circuit patterns 22a and 22b are embedded in the resin layer 21. At this time, part of the resin layer 21 pressed by the circuit patterns 22a and 22b projects from the gap between the circuit patterns 22a2 and 22a3 as illustrated in FIG. 8, for example. Then, the resin layer 21 between the circuit patterns 22a2 and 22a3 is sealed with a sealing member 66 and is pressed toward a base plate 23. Therefore, the circuit patterns 22a2 and 22a3 are prevented from peeling off the resin layer 21 and a decrease in the heat dissipation performance of the insulated circuit substrate 20 is also prevented, as in the third embodiment. In addition, the resin layer 21 projects from between the circuit patterns 22a2 and 22a3. Therefore, the length (creepage distance) of the interface between the sealing member 66 and the resin layer 21 becomes long, and the insulating property between the circuit patterns 22a2 and 22a3 and the base plate 23 is improved. This is the same with the other circuit patterns 22a and 22b, in addition to the circuit patterns 22a2 and 22a3. As a result, it is achieved to prevent both a decrease in the heat dissipation performance of the semiconductor device 10 and a reduction in the long-term reliability thereof.

In addition, in the insulated circuit substrate 20, when the circuit patterns 22a and 22b are pressed against the resin layer 21 with higher pressure, the resin layer 21 projects from the gap between the circuit patterns 22a2 and 22a3 and crawls up to the front surfaces of the circuit patterns 22a2 and 22a3, as illustrated in FIG. 9. In this case as well, as in FIG. 8, the length (creepage distance) of the interface between the sealing member 66 and the resin layer 21 becomes longer, and the insulating property between the circuit patterns 22a2 and 22a3 and the base plate 23 is improved. The resin layer 21 crawling up to the front surfaces of the circuit patterns 22a2 and 22a3 presses the circuit patterns 22a2 and 22a3 toward the base plate 23. This further prevents the circuit patterns 22a2 and 22a3 from peeling. This is the same with the other circuit patterns 22a and 22b, in addition to the circuit patterns 22a2 and 22a3.

Fifth Embodiment

Figure 10:
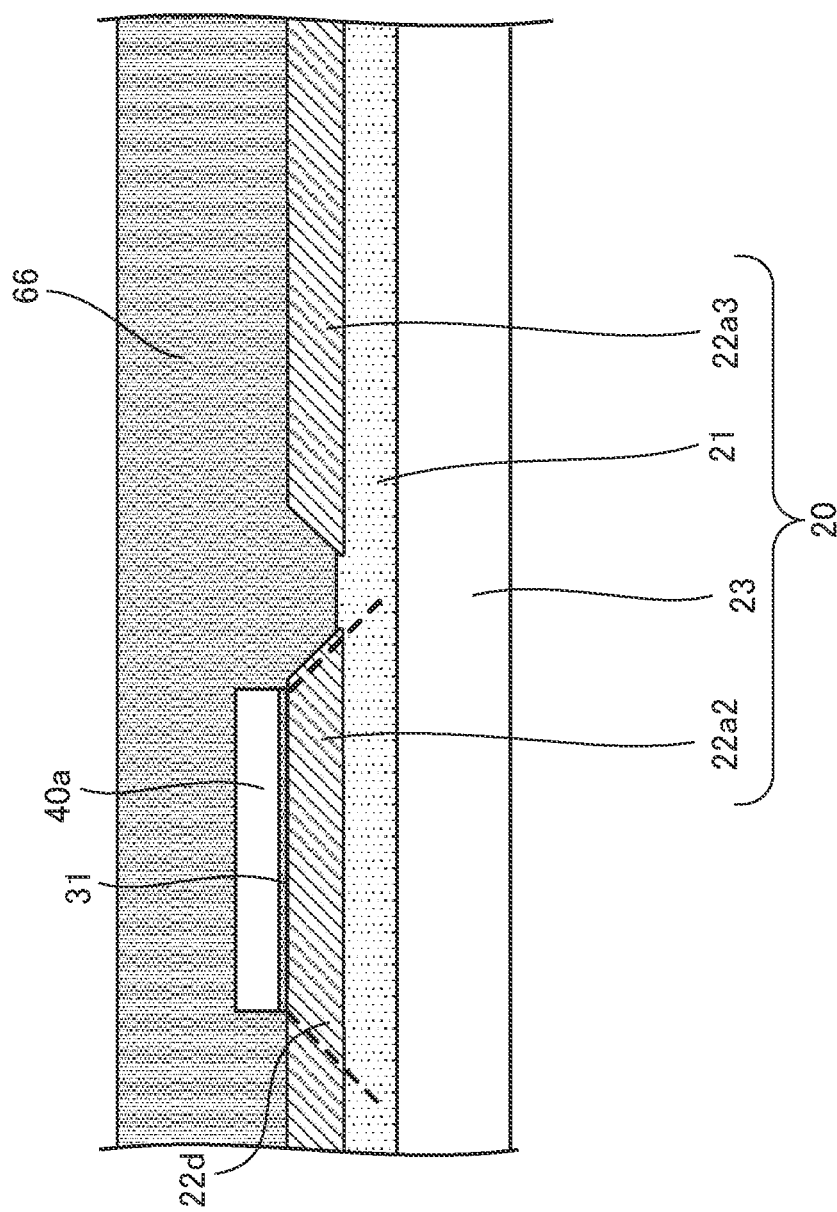
FIG. 10 is a sectional view of a main part of a semiconductor device according to a fifth embodiment.

A fifth embodiment describes the case where edge corners of the circuit patterns 22a and 22b are chamfered in the insulated circuit substrate 20 provided in the semiconductor device 10 of the second embodiment. This case will be described below with reference to FIG. 10. FIG. 10 is a sectional view of a main part of a semiconductor device according to the fifth embodiment. In this connection, FIG. 10 corresponds to a sectional view taken along the dot-dashed line X-X of the semiconductor device 10 of FIG. 3, and illustrates an area around the semiconductor chip 40a illustrated in this sectional view.

In this case, an edge corner of the front surface of each circuit pattern 22a2 and 22a3 included in an insulated circuit substrate 20 is chamfered along its outer peripheral edge. For example, the edge corner is chamfered at such an angle as not to reach a heat spreading area formed in the circuit pattern 22a2 of a semiconductor chip 40a. The above circuit patterns 22a2 and 22a3 are sealed with a sealing member 66. For example, in the case where the edge corners of the circuit patterns 22a2 and 22a3 are not chamfered, as in FIG. 7, the edge corners of the circuit patterns 22a2 and 22a3 may allow to form a crack, which may then extend into the sealing member 66. If the crack extends into the sealing member 66, moisture enters the crack, which reduces the insulating property of the sealing member 66. By contrast, in the present embodiment, the edge corners of the circuit patterns 22a2 and 22a3 are chamfered, so that the edge corners do not allow to form a crack, which would extend into the sealing member 66, and thus the occurrence of the crack is prevented. This is the same with the other circuit patterns 22a and 22b, in addition to the circuit patterns 22a2 and 22a3. Therefore, the insulating property of the semiconductor device 10 is maintained, and it is achieved to prevent both a decrease in the heat dissipation performance of the semiconductor device 10 and a reduction in the long-term reliability thereof.

According to the disclosed technique, it is achieved to reduce the occurrence of warping and to prevent a reduction in the long-term reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    an insulated circuit substrate, including
        a base plate,
        a resin layer disposed on a front surface of the base plate, and
        a circuit pattern disposed on a front surface of the resin layer; and
    a semiconductor chip that is rectangular in a plan view of the semiconductor device and is bonded to a front surface of the circuit pattern in such a manner that a side edge of the semiconductor chip is spaced inwardly from an outer peripheral edge of the circuit pattern by at least a predetermined distance, wherein
    both the predetermined distance and a thickness of the circuit pattern are greater than or equal to 0.1 of a length of one side of the semiconductor chip, and
    in a depth direction of the semiconductor device, a bottommost portion of the circuit pattern is closer to the base plate than is a topmost portion of the resin layer, and a topmost portion of the circuit pattern is farther from the base plate than is the topmost portion of the resin layer.

2. The semiconductor device according to claim 1, further comprising
    another semiconductor chip bonded to the front surface of the circuit pattern, the another semiconductor chip being adjacent to the semiconductor chip in a side view of the semiconductor device,
    wherein another side edge of the semiconductor chip, and a side edge of the another semiconductor chip adjacent to said another side edge, have a gap therebetween in the side view, the gap being greater than or equal to twice the predetermined distance.

3. The semiconductor device according to claim 2, further comprising a wiring member bonded to the front surface of the circuit pattern in the gap.

4. The semiconductor device according to claim 2, further comprising a groove formed in the gap in the front surface of the circuit pattern, the groove being parallel to the semiconductor chip and the another semiconductor chip in the plan view.

5. The semiconductor device according to claim 4, wherein
    the circuit pattern has a heat spreading area that is an area in which heat generated by the semiconductor chip is spreadable as the heat moves toward the resin layer, and
    the groove has such a depth that the groove does not reach an outermost edge of the heat spreading area, the outermost edge being beveled at 45 degrees in the side view.

6. The semiconductor device according to claim 1, wherein the circuit pattern is embedded in the resin layer in such a manner that the front surface of the circuit pattern is flush with the front surface of the resin layer.

7. The semiconductor device according to claim 1, wherein
    the circuit pattern has a heat spreading area that is an area in which heat generated by the semiconductor chip is spreadable as the heat moves toward the resin layer, an outermost edge of the heat spreading area being beveled at 45 degrees in a side view of the semiconductor device,
    the circuit pattern is chamfered, and
    the outermost edge of the heat spreading area is within the chamfered circuit pattern.

8. The semiconductor device according to claim 1, wherein the circuit pattern has a sag at a first side thereof facing the resin layer, and has a burr at a second side thereof that is a side of the front surface of the circuit pattern and opposite to the first side.

9. The semiconductor device according to claim 1, further comprising
    a non-disposition circuit pattern disposed together with the circuit pattern on the front surface of the resin layer, the non-disposition circuit pattern being a pattern on which the semiconductor chip is not disposed,
    wherein the non-disposition circuit pattern is thinner than the circuit pattern.

10. The semiconductor device according to claim 9, wherein
    the semiconductor chip has a control electrode, and
    the non-disposition circuit pattern is a control circuit pattern that is electrically connected to the control electrode of the semiconductor chip.

11. The semiconductor device according to claim 1, wherein the length of the one side of the semiconductor chip is less than or equal to 5.5 mm.

\* \* \* \* \*